United States Patent
Ohta et al.

(10) Patent No.: US 7,102,085 B2
(45) Date of Patent: Sep. 5, 2006

(54) WIRING SUBSTRATE

(75) Inventors: Sumio Ohta, Aichi (JP); Mitsuru Tamaki, Aichi (JP); Yukihiro Kimura, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 39 days.

(21) Appl. No.: 10/103,039

(22) Filed: Mar. 22, 2002

(65) Prior Publication Data

US 2002/0145197 A1 Oct. 10, 2002

(30) Foreign Application Priority Data

Mar. 23, 2001 (JP) .............................. 2001-086015

(51) Int. Cl.
*H05K 1/16* (2006.01)

(52) U.S. Cl. ................................... 174/260

(58) Field of Classification Search ........ 174/260–266; 361/760–763, 782, 792, 793, 765, 766, 795

See application file for complete search history.

(56) References Cited

U.S. PATENT DOCUMENTS

| | | | |
|---|---|---|---|
| 6,272,020 B1 * | 8/2001 | Tosaki et al. ............... | 361/763 |
| 6,326,561 B1 * | 12/2001 | Watanabe et al. ........... | 174/264 |
| 6,329,610 B1 * | 12/2001 | Takubo et al. .............. | 174/264 |
| 6,370,013 B1 * | 4/2002 | Iino et al. ................. | 361/306.3 |
| 6,373,000 B1 * | 4/2002 | Nakamura et al. .......... | 174/264 |
| 6,392,301 B1 * | 5/2002 | Waizman et al. ........... | 257/774 |
| 6,426,470 B1 * | 7/2002 | Farquhar et al. ............ | 174/266 |
| 6,480,395 B1 * | 11/2002 | Kopf .......................... | 361/760 |
| 6,495,770 B1 * | 12/2002 | Li et al. ..................... | 174/255 |
| 6,506,982 B1 * | 1/2003 | Shigi et al. ................. | 174/264 |

* cited by examiner

*Primary Examiner*—David A. Zarneke
(74) *Attorney, Agent, or Firm*—Sughrue Mion, PLLC

(57) ABSTRACT

A wiring substrate is configured such that a build-up layer is formed only on a front surface (a single side) of a core substrate and such that the distance between a semiconductor device mounted on the front surface thereof and an electronic component mounted on the back surface thereof or incorporated therein behind the back surface is reduced to thereby enhance electrical characteristics of an electrically continuous path therebetween, and whose overall strength is enhanced so as not to be prone to deflection or warpage. The wiring substrate includes a relatively thin first core substrate 2 having a front surface 3 and a back surface 4; a relatively thick second core substrate 6 superposed on the back surface 4 of the first core substrate 2 and having a through opening 9 formed therein, the first substrate 2 and the through opening 9 defining a recess 9; and a build-up layer BU formed on the front surface 3 of the first core substrate 2 and including wiring layers 16 and 25 and dielectric layers 23 and 26.

20 Claims, 7 Drawing Sheets

WIRING SUBSTRATE

BACKGROUND OF THE INVENTION

1. Field of the Invention

The present invention relates to a wiring substrate having a build-up layer superposed on one side of a core substrate.

2. Description of the Related Art

FIG. 7 shows a cross section of a main portion of a wiring substrate 40 including a core substrate 41, a build-up layer BU1 formed on a front surface 42 of the core substrate 41, and a build-up layer BU2 formed on a back surface 43 of the core substrate 41. The core substrate 41 is formed of a glass-epoxy resin and has a relatively small thickness of 0.2–0.4 mm. A plurality of through holes 44 are formed in the core substrate 41 so as to extend between the front surface 42 and the back surface 43. Each of the through holes 44 has a through hole conductor 45 formed therein and is filled with a filter resin 46.

As shown in FIG. 7, a predetermined pattern of a wiring layer 48 is formed on the front surface 42 of the core substrate 41 and is connected to the upper ends of the through hole conductors 45. A dielectric layer 50 formed of an epoxy resin is formed on the front surface 42 and on the wiring layer 48, and filled via conductors 52 are formed in the dielectric layer 50 at predetermined positions located on the wiring layer 48.

As shown in FIG. 7, a dielectric layer 56 and a wiring layer 54 are formed on the dielectric layer 50, and the wiring layer 54 is connected to the upper ends of the via conductors 52. Filled vias 58 are formed in the dielectric layer 56 at predetermined positions located on the wiring layer 54. A solder resist layer (a dielectric layer) 60 and a wiring layer 62 are formed on the dielectric layer 56, and the wiring layer 62 is connected to the upper ends of the via conductors 58. The wiring layers 48, 54, and 62 and the dielectric layers 50, 56, and 60 constitute the build-up layer BU1.

As shown in FIG. 7, a plurality of solder bumps 66 are separately formed on the wiring layer 62 at predetermined positions so as to project upward from a first main surface 64, which is the surface of the solder resist layer 60. The bumps 66 are connected to corresponding connection terminals 70 formed on the bottom surface of an IC chip (a semiconductor device) 68 to be mounted on the first main surface 64.

A copper reinforcement (stiffener) 72, which is a frame having a substantially rectangular shape as viewed from above, is bonded onto the first main surface 64 by use of an unillustrated adhesive so as to surround the IC chip 68.

As shown in FIG. 7, a wiring layer 47 is formed on the back surface 43 of the core substrate 41 and is connected to the lower ends of the through hole conductors 45. As in the case of the build-up layer BU1, a build-up layer BU2 is formed on the wiring layer 47, build-up layer BU2 including dielectric layers 49 and 55, a solder resist layer (a dielectric layer) 63, wiring layers 53 and 59, and filled via conductors 51 and 57. A plurality of solder bumps 67 are separately formed on the wiring layer 59 at predetermined positions so as to project downward from a second main surface 65. The bumps 67 are connected to corresponding connection terminals 71 formed on chip capacitors (electronic components) 69 to be mounted on the second main surface 65.

3. Problems to be Solved by the Invention

However, in the above-described wiring substrate 40 configured such that the build-up layers BU1 and BU2 are formed on the corresponding opposite sides of the core substrate 41, the IC chip 68 is electrically connected to the chip capacitors 69 via the wiring layers 62, 54, and 48, the through hole conductors 45, the wiring layers 47, 58, 59, etc. As a result, the electrically continuous path becomes long, resulting in instability of electrical characteristics, such as an increase in loop inductance.

In order to cope with the above problem, the distance between the IC chip 68 and the chip capacitor 69 can be reduced in the following manner: the thickness of the core substrate 41 is reduced to 0.4 mm or less, and only the build-up layer BU1 on the front surface 42 is formed. However, in this case, the strength of the overall wiring substrate 40 is reduced, resulting in deflection or warpage. In order to prevent such deflection or warpage, the metallic reinforcement 72 must be disposed on the first main surface 64, resulting in increased cost.

SUMMARY OF THE INVENTION

An object of the present invention is to solve the above-described problems of the prior art and to provide a wiring substrate configured such that a build-up layer, which includes a plurality of wiring layers and a plurality of dielectric layers, is formed only on a single side (a front surface) of a core substrate and such that the distance between a semiconductor device (an IC chip) mounted on the front surface thereof and an electronic component (a chip capacitor or a like component) mounted on the back surface thereof or incorporated therein behind the back surface is reduced to thereby enhance electrical characteristics of an electrically continuous path therebetween. Another object of the present invention is to provide a wiring substrate whose overall strength is enhanced so as not to be prone to deflection or warpage.

The above-described objects of the present invention have been accomplished by combining two core substrates.

Specifically, the wiring substrate of the present invention comprises a first core substrate having a front surface and a back surface; a second core substrate superposed on the back surface of the first core substrate and having a through opening formed therein, the first substrate and the through opening defining a recess; and a build-up layer formed on the front surface of the first core substrate and comprising a plurality of wiring layers and a plurality of dielectric layers.

The use of first and second core substrates after lamination thereof avoids the necessity of a conventionally employed expensive reinforcement and process for bonding the reinforcement, thereby allowing low-cost fabrication of a wiring substrate. The ability to mount or contain an electronic component in a recess defined by the two core substrates enables reduction in the length of an electrically continuous path extending between the electronic component and a semiconductor device, such as an IC chip, mounted on the surface of the build-up layer. Thus, internal electrical characteristics can be stabilized, as represented by a decrease in loop inductance. Further, it is possible to utilize, as wiring paths to IC connection terminals to be connected to an IC chip, not only through hole conductors extending through the first core substrate, but also those extending through the first and second core substrates.

Herein, a core substrate is a dielectric plate material and does not include a wiring layer formed on its front or back surface.

Additionally, the wiring substrate (which comprises a first core substrate having a front surface and a back surface; a second core substrate superposed on the back surface of the first core substrate and having a through opening formed therein, the first substrate and the through opening defining a recess; and a build-up layer formed on the front surface of the first core substrate and comprising a plurality of wiring layers and a plurality of dielectric layers) can further comprise a single wiring layer, or a single wiring layer and a single dielectric layer (a solder resist layer) formed on a surface of the second core substrate located on the side opposite the back surface of the first core substrate (i.e., on the back surface of the second core substrate).

In this case, in addition to the above-described effects, the cost of forming a number of via conductors, wiring layers, and dielectric layers can be eliminated, since no build-up layer is formed on the back surface of the second core substrate. Also, wiring of the single wiring layer can serve as connection terminals for connection to a mother board or a like board on which the wiring substrate is to be mounted.

In a second aspect of the present invention, the second core substrate having the through opening formed therein is thicker than the first core substrate. This structural feature allows a reliable reduction in the length of an electrically continuous path extending between an electronic component mounted or contained in the recess and a semiconductor device mounted on the surface of the build-up layer. Thus, internal electrical characteristics can be further stabilized, as represented by a decrease in loop inductance. Further, the relatively thick second core substrate reinforces the relatively thin first core substrate, thereby avoiding the necessity of employing an expensive reinforcement and a process for bonding the reinforcement, and thus reliably allowing low-cost fabrication of a wiring substrate.

In yet another aspect of the present invention, a bonding layer and a wiring layer are interposed between the first core substrate and the second core substrate having the through opening formed therein.

This structural feature allows the formation of a plurality of wiring layers between the first and second core substrates, thereby allowing easy enhancement of internal wiring density and allowing a reduction in power supply noise, which is transmitted from a power supply to an electronic component (a chip capacitor or a like component) as a result of forming a ground layer; i.e., thereby allowing a reduction in inductance. Notably, components present between the first and second core substrates can be limited to a bonding layer.

In yet another aspect of the invention, a plurality of wiring layers are interposed between the first and second core substrates, thereby allowing easy enhancement of internal wiring density.

In yet another aspect of the present invention, the first core substrate has a thickness of not less than 100 μm and not greater than 400 μm, and the second core substrate has a thickness of not less than 500 μm and not greater than 1000 μm.

This structural feature imparts an appropriate thickness to the first and second core substrates, whereby the wiring substrate avoids the necessity of employing a reinforcement and can be fabricated at low cost.

When the thickness of the first core substrate is less than 100 μm, the first core substrate has deteriorated handling properties and is thus prone to damage. When the thickness is in excess of 400 μm, the distance between a semiconductor device, such as an IC chip, mounted on the build-up layer and an electronic component mounted on the back surface side becomes long, resulting in a failure to stabilize electrical characteristics. Therefore, the above-mentioned thickness range is specified. When the thickness of the second core substrate is less than 500 μm, the second core substrate fails to enhance the strength of the overall wiring substrate. When the thickness is in excess of 1000 μm, accuracy in cutting through holes is impaired. Therefore, the above-mentioned thickness range is specified.

In yet another aspect of the present invention, a plurality of IC connection terminals are arranged on the surface of the build-up layer, and electronic component connection terminals are arranged within the recess. In this case, a semiconductor device connected to the plurality of IC connection terminals and an electronic component connected to the electronic component connection terminals are connected over a relatively short distance via the first core substrate, thereby achieving an improvement in electrical characteristics, such as a decrease in loop inductance of a path extending therebetween.

In yet another aspect of the present invention, the recess contains an electronic component having electronic component connection terminals capable of being electrically connected to a wiring layer of the build-up layer. In this case, the electronic component can be electrically connected to a semiconductor device (an IC chip) mounted on the surface of the build-up layer, via a short electrically continuous path.

In yet another aspect of the present invention, an electronic component is contained in the recess via an embedding resin. In this case, an electronic component, such as a chip capacitor, can be firmly contained in the recess; the strength of the wiring substrate can be enhanced; and the electronic component can be electrically connected to a semiconductor device (an IC chip) mounted on the surface of the build-up layer via a short electrically continuous path.

Examples of the above-mentioned electronic component include, but are not limited to, passive components, such as capacitors, inductors, resistors, and filters; active components, such as low noise amplifiers (LNAs), transistors, semiconductor devices, and FETs; and SAW filters, LC filters, antenna switch modules, couplers, and diplexers, as well as those implemented in the form of a chip. Among these electronic components, those of different kinds may be contained in the same recess. Further, an electronic component may be configured such that, when mounted on or in the second core substrate, electrodes provided thereon may be located on only the front surface side or the back surface side of the second core substrate.

DESCRIPTION OF REFERENCE NUMERALS

Figure 1:
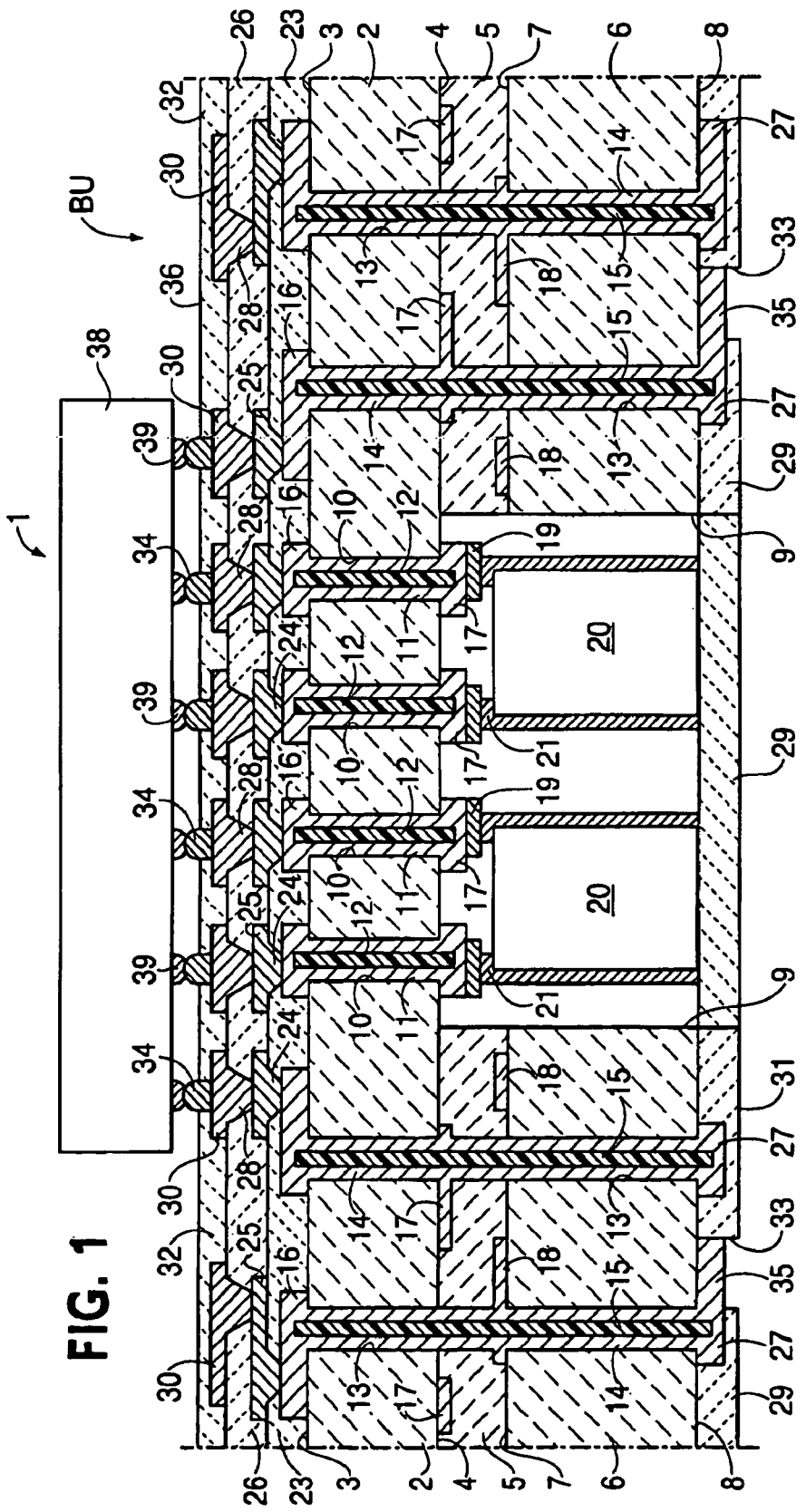
FIG. 1 is a sectional view showing a main portion of a wiring substrate according to an embodiment of the present invention.

1, 1*a*, 1*b* . . . wiring substrate
2 . . . first core substrate
3 . . . front surface 4 . . . back surface
5 . . . dielectric layer (bonding layer)
6 . . . second core substrate
9 . . . recess/through opening
16, 25, 30 . . . wiring layer
23, 26, 32 . . . dielectric layer
BU . . . build-up layer

DETAILED DESCRIPTION OF THE PREFERRED EMBODIMENTS

Embodiments of the present invention will next be described with reference to the drawings. However, the present invention should not be construed as being limited thereto.

FIG. 1 is a sectional view showing a main portion of a wiring substrate 1 according to an embodiment of the present invention.

As shown in FIG. 1, the wiring substrate 1 includes a relatively thin first core substrate 2 having a thickness of, for example, 200 μm; a relatively thick second core substrate 6 having a thickness of, for example, 800 μm; and a build-up layer BU formed on a front surface 3 of the first core substrate 2 and including wiring layers 16 and 25 and dielectric layers 23 and 26.

The first core substrate 2 includes the front surface 3 and a back surface 4, has a thickness of not less than 100 μm and not greater than 400 μm, and is formed of a glass-epoxy resin. A plurality of through holes 10 having a diameter of about 100 μm extend through a central portion of the first core substrate 2. A through hole conductor 11 made of copper and having a thickness of about 25 μm is formed on the inner wall of each through hole 10, and each through hole 10 is filled with a filler resin 12.

As shown in FIG. 1, the second core substrate 6 includes a front surface 7 and a back surface 8, has a thickness of not less than 600 μm and not greater than 1000 μm, and is formed of a glass-epoxy resin. A recess 9 is formed in a substantially central portion of the second core substrate 6. The recess 9 assumes a substantially square shape, which measures about 14 mm×about 14 mm as viewed from underneath.

The first core substrate 2 and the second core substrate 6 are laminated in the thickness direction thereof via a dielectric layer (a bonding layer formed of prepreg) 5 having a thickness of about 60 μm and adhesive properties.

As shown at the left and right of FIG. 1, a plurality of through holes 13 having a diameter of about 100 μm extend through the first and second core substrates 2 and 6 and the dielectric layer 5. A long through hole conductor 14 made of copper and having a thickness of about 25 μm is formed on the inner wall of each through hole 13, and each through hole 13 is filled with a filler resin 15.

As shown in FIG. 1, a predetermined pattern of a copper wiring layer 17 having a thickness of about 15 μm is formed on the back surface 4 of the first core substrate 2 and is connected to the lower ends of the through hole conductors 11 and intermediate portions of certain through hole conductors 14. Similarly, a predetermined pattern of a copper wiring layer 18 having a predetermined thickness is formed on the front surface 7 of the second core substrate 6 and is connected to intermediate portions of certain through hole conductors 14.

Further, as shown in FIG. 1, a copper wiring layer 16 is formed of copper in a predetermined pattern on the front surface 3 of the first core substrate 2 and is connected to the upper ends of certain through hole conductors 11 and 14. A dielectric layer 23 of an epoxy-resin is formed on the front surface 3 and the wiring layer 16, and filled via conductors 24 are formed in the dielectric layer 23 at predetermined positions located on the wiring layer 16. On the dielectric layer 23, a dielectric layer 26 and a wiring layer 25, which is connected to the upper ends of the via conductors 24, are formed, and filled via conductors 28 are formed in the dielectric layer 26 at predetermined positions located on the wiring layer 25. Similarly, on the dielectric layer 26, a solder resist layer (a dielectric layer) 32 and a wiring layer 30, which is connected to the upper ends of the via conductors 28, are formed.

The wiring layers 16, 25, 30 and the dielectric layers 23, 26, and 32 constitute the build-up layer BU. Notably, the dielectric layer 23 has a thickness of about 30 μm, and the solder resist layer 26 has a thickness of about 25 μm.

As shown in FIG. 1, a plurality of solder bumps (IC connection terminals) 34 are separately formed on the wiring layer 30 at predetermined positions so as to project upward from a first main surface (front surface) 36. The bumps 34 are connected to a plurality of corresponding connection terminals 39 located on the bottom surface of an IC chip (a semiconductor device) 38 to be mounted on the first main surface 36.

The solder bumps 34 are made of a low-melting-point alloy of Sn—Ag, Sn—Ag—Cu, Sn—Cu, Pb—Sn, Sn—Zn, or the like (an Sn—Cu alloy in the present embodiment) and are arranged such that the center-to-center distance (the pitch) of the adjacent solder bumps 34 is about 150 μm. The plurality of solder bumps 28 and connection terminals 34 are embedded in an unillustrated underfill material.

As shown in FIG. 1, a plurality of chip capacitors (electronic components) 20 are mounted in the recess 9, which is defined by the first and second core substrates 2 and 6, via a solder (Sn—Sb) 19. The chip capacitor 20 has a plurality of electrodes 21, which project upward from the upper ends of the opposite side walls thereof and are arranged along the direction perpendicular to the drawing sheet of FIG. 1. The chip capacitor 20 is a ceramic capacitor configured such that dielectric layers, which contain barium titanate as a main component, and Ni layers serving as internal electrodes are arranged in alternating layers, and has a size of 3.2 mm×1.6 mm×0.7 mm.

The electrodes 21 of the chip capacitors 20 are connected, via the solder 19, to the wiring layer (the electronic component connection terminals) 17 located at the lower ends of the through hole conductors 11.

Notably, the solder 19 is made of a low-melting-point alloy having a melting point relatively higher than that of the solder bump 28.

Further, as shown in FIG. 1, a solder resist layer (a dielectric layer )29 having a thickness similar to that mentioned previously is formed on the back surface 8 of the second core substrate 6 and a wiring layer 27. A wiring 35 in the wiring layer 27 is exposed in openings 33, which are formed in the solder resist layer 29 so as to open at the surface (the lower surface) of the solder resist layer 29, which surface serves as a second main surface 31. The surface of the wiring 35 is plated with Ni and Au to thereby serve as a connection terminal for connection to an unillustrated printed wiring board, such as a mother board, on which the wiring substrate 1 is to be mounted.

The recess 9, in which the chip capacitors 20 are mounted, opens downward at the second main surface 31; i.e., the recess 9 is not covered with the wiring layer 27 and the solder resist layer 29.

According to the thus-configured wiring substrate 1, the thin first core substrate 2 and the thick second core substrate 6 are laminated via the dielectric layer (the bonding layer) 5, and the build-up layer BU is formed on the front surface 3 of the first core substrate 2, thereby avoiding the necessity of employing a conventionally employed expensive metallic reinforcement, and thus allowing low-cost fabrication. Also, the connection terminals 39 of the IC chip 38 mounted on the first main surface 36 and the electrodes 21 of the chip capacitors 20 contained in the recess 9 are connected via short paths; specifically, via the solder bumps 34, the wiring layers 30, 25, and 16, the via conductors 28 and 24, the short through hole conductors 11, and the solder 19. Thus, the loop inductance and the resistance of the paths can be reduced, whereby stable electrical continuity can be established.

Further, the plurality of solder bumps 34 projecting from the first main surface 36 can be formed not only at positions corresponding to wiring which is routed along the through hole conductors 11 extending through the first core substrate 2 and electrically connected to the electronic components 20 but also at positions corresponding to wiring which is routed along the through hole conductors 14 extending through the first and second core substrates 2 and 6. Accordingly, the plurality of solder bumps 34 can be arranged at high density, whereby the IC chip 38 having a number of connection terminals 39 can be reliably mounted.

Therefore, the wiring substrate 1 can be fabricated at low cost, exhibits stable internal electrical characteristics, and is not prone to deflection or warpage.

Figure 2:
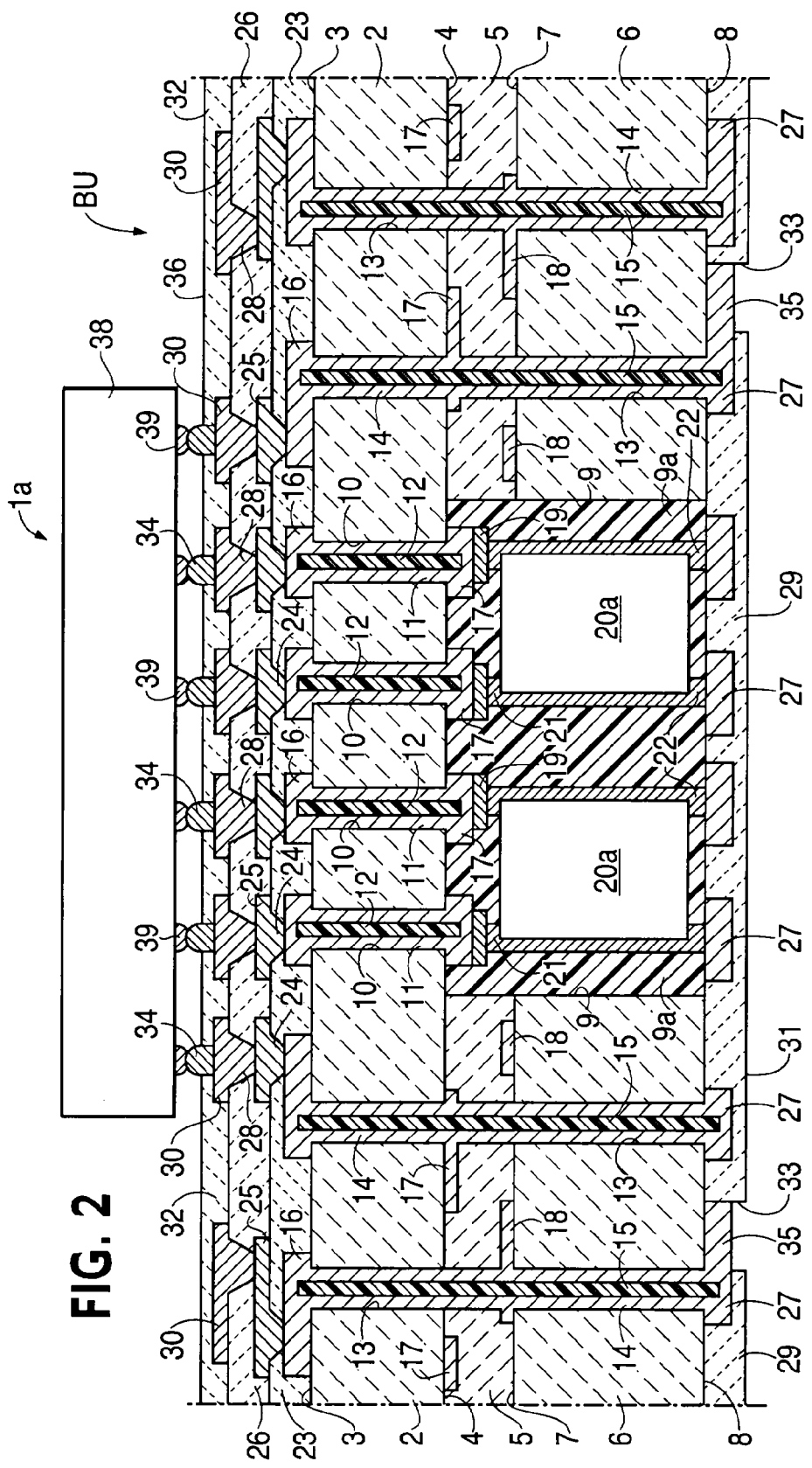
FIG. 2 is a sectional view showing a main portion of a wiring substrate according to a modified embodiment of the wiring substrate of FIG. 1.

FIG. 2 is a sectional view showing a main portion of a wiring substrate 1a according to a modified embodiment of the wiring substrate 1. As shown in FIG. 2, the wiring substrates 1 and 1a assume a basic structure in common; for example, they employ the first and second core substrates 2 and 6 and the build-up layer BU including the wiring layers 16 and 25 and the dielectric layers 23 and 26. Points of difference will be described below.

As shown in FIG. 2, a plurality of chip capacitors (electronic components) 20a are contained via an embedding resin 9a in the recess 9, which is defined by the first and second core substrates 2 and 6. Each of the chip capacitors 20a assumes a size and structure similar to those described previously and includes a plurality of electrodes 21 and 22, which project upward and downward from the upper and lower ends of the opposite side walls thereof and are arranged along the direction perpendicular to the drawing sheet of FIG. 2.

The electrodes 21 projecting from the upper end of each capacitor 20a are connected to the wiring layer 17 via the solder 19 as described previously, whereas the electrodes 22 projecting from the lower end of each capacitor 20a are connected to the wiring layer 27, which is formed of copper in a predetermined pattern on the back surface 8 of the second core substrate 6 and a surface of the embedding resin 9a. The embedding resin 9a is covered from underneath with the solder resist layer 29.

In addition to the previously mentioned advantages of the wiring substrate 1, the thus-configured wiring substrate 1a has the advantage that the chip capacitors 20a can be firmly contained in the recess 9.

Major steps for fabricating the wiring substrates 1 and 1a will next be described with reference to FIGS. 3 to 5.

Figure 3A:
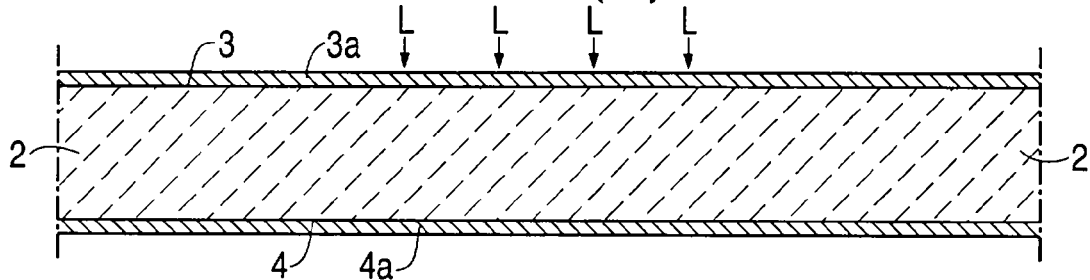
FIGS. 3(A) to 3(D) are schematic views showing major steps for fabricating the wiring substrates of FIG. 1 and 2.

FIG. 3(A) shows the first core substrate 2, which has a thickness of about 400 μm and has copper foils 3a and 4a of a thickness of about 18 μm bonded to the front and back surfaces 3 and 4. As shown in FIG. 3(A), a laser beam L emitted from a $CO_2$ laser or a like laser is applied to a central portion of the front surface 3 of the first core substrate 2 at predetermined positions.

Figure 3B:
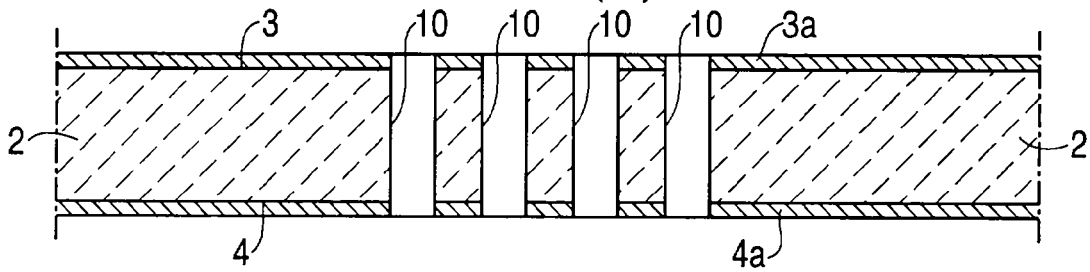

As a result, as shown in FIG. 3(B), a plurality of through holes 10 having a diameter of about 100 μm are formed in the first core substrate 2 so as to extend between the front and back surfaces 3 and 4. In place of laser beams L, a small-diameter drill may be used for drilling the through holes 10.

Next, the entire surface of the first core substrate 2 having the plurality of through holes 10 is subjected to electroless copper plating and copper electroplating. Notably, a plating catalyst which contains Pd is applied beforehand to the inner walls of the through holes 10. The above-mentioned formation of the through holes 10 and copper plating may be performed for a panel which includes a plurality of first core substrates 2 (product units).

Figure 3C:
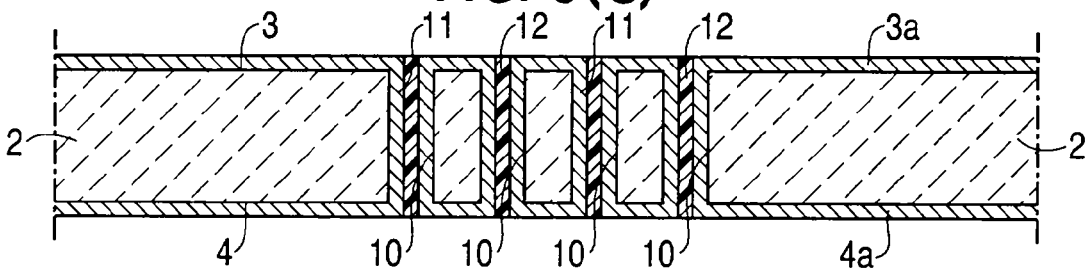

As a result, as shown in FIG. 3(C). the through hold conductor 11 having a thickness of about 25 μm is formed on the inner wall of each through hole 10. The plated through holes 10 are filled with the filler resin 12, which is an epoxy resin that contains an inorganic filler, such as a silica filler. In place of the filler resin 12, an electrically conductive resin which contains a large amount of a metal powder or an electrically nonconductive resin which contains a metal powder may be employed.

Next, unillustrated etching resist is deposited in a predetermined pattern on the copper foils (including the above-described copper plating layers) 3a and 4a on the front and back surfaces 3 and 4 using a known photolithographic technique. Subsequently, portions of the copper foils 3a and 4a which are exposed through the etching resist pattern are subjected to etching (by a known subtractive process).

Figure 3D:
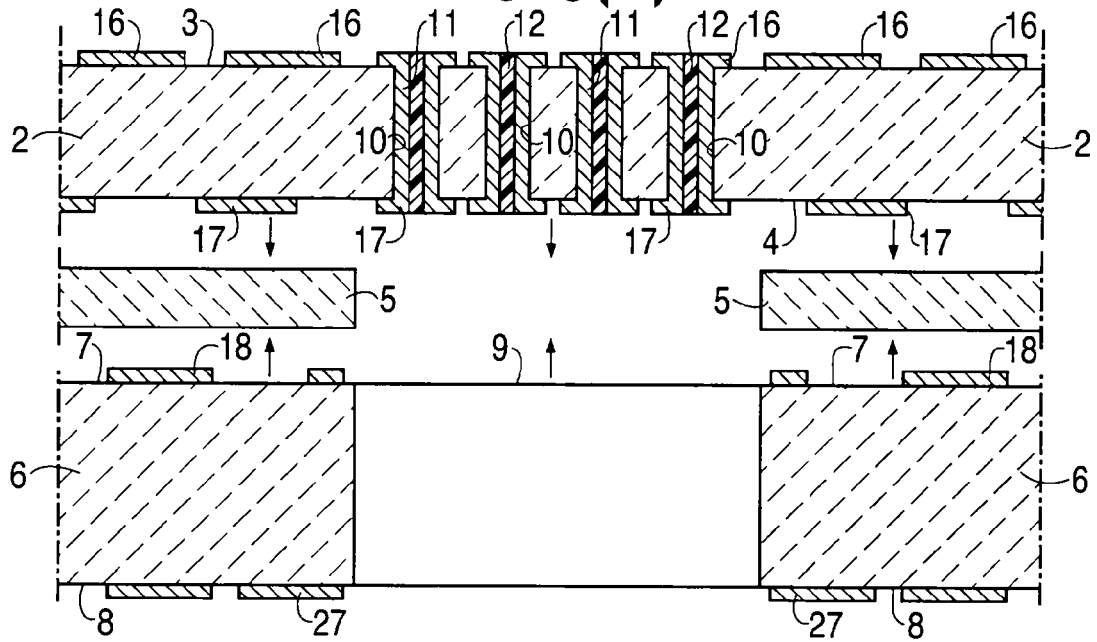

As a result, as shown in an upper region of FIG. 3(D), the wiring layers 16 and 17 are formed, according to the above-mentioned patterns, on the front and back surfaces 3 and 4 of the first core substrate 2.

As shown in a lower region of FIG. 3(D), the second core substrate 6 having a thickness of about 800 μm is separately prepared. In the core substrate 6, the wiring layers 18 and 27 are formed beforehand in respectively predetermined patterns on the front and back surfaces 7 and 8 by a method similar to that described above, and a through opening 9, which is substantially square as viewed from above, is formed at a central portion thereof through punching or a like method.

As shown in FIG. 3(D), while the dielectric layer (the bonding layer) 5 formed of a resin having adhesive properties (prepreg) is disposed between the back surface 4 of the first core substrate 2 and the front surface 7 of the second core substrate 6 in a region excluding the through opening 9, the first and second core substrates 2 and 6 are united under pressure along the directions of the arrows in FIG. 3(D) while heat is applied. In addition to the prepreg 5, film-like bonding layers may be used.

Figure 4A:
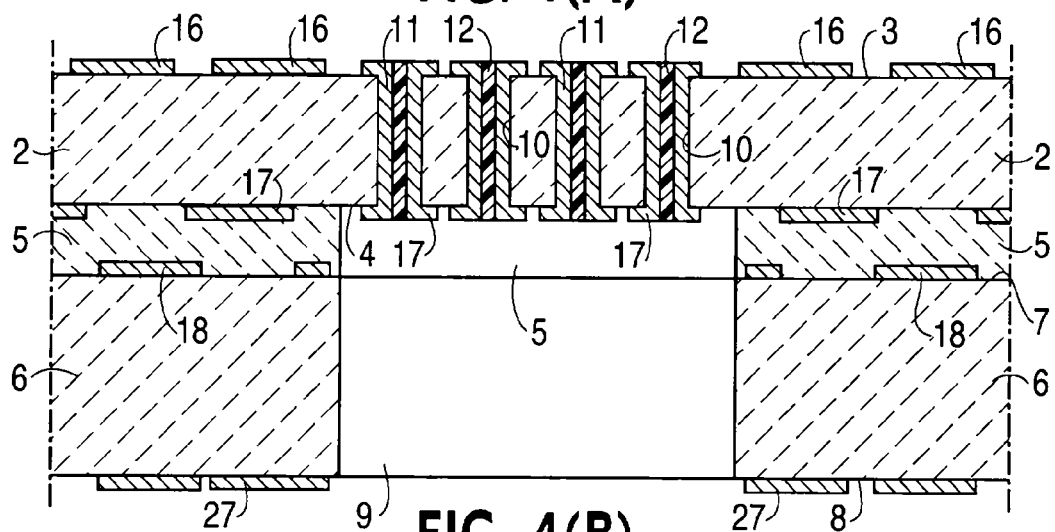
FIGS. 4(A) to 4(C) are schematic views showing major fabrication steps subsequent to that of FIG. 3(D).

As a result, as shown in FIG. 4(A), the first and second core substrates 2 and 6 are laminated via the dielectric layer 5, and the through opening 9 becomes the recess 9, which opens at the back surface 8 of the second core substrate 6. In this state, holes are cut in the right-hand and left-hand regions of FIG. 4(A); i.e., in a region excluding that located above the recess 9, at predetermined positions through application of laser beam L or drilling as described previously with reference to FIG. 3.

Figure 4B:
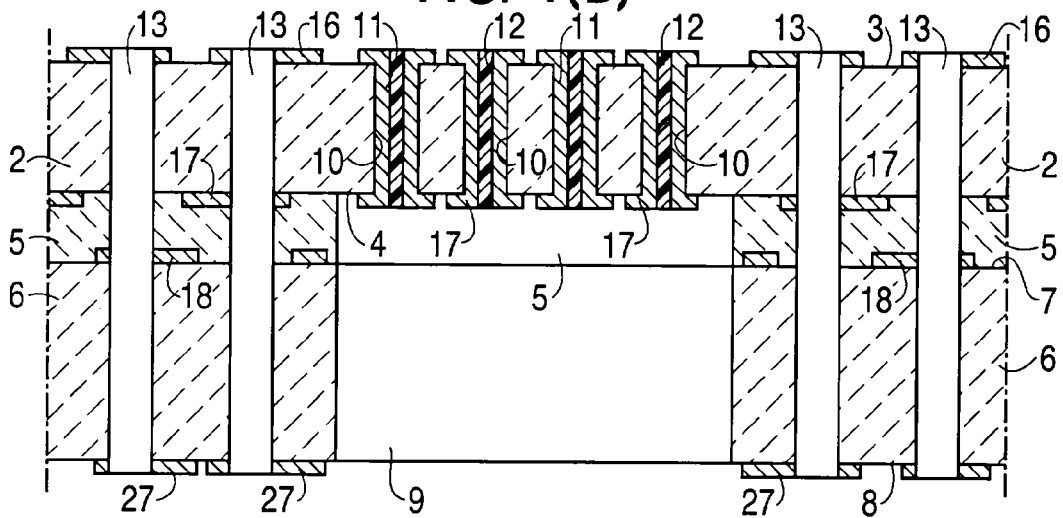

As a result, as shown in FIG. 4(B), the long through holes 13 are separately formed at right-hand and left-hand predetermined positions so as to extend between the front surface 3 of the first core substrate 2 and the back surface 8 of the second core substrate 6 while extending through the dielectric layer 5. The through holes 13 extend through the wiring layers 17 and 18 located on opposite sides of the dielectric layer 5.

Figure 4C:
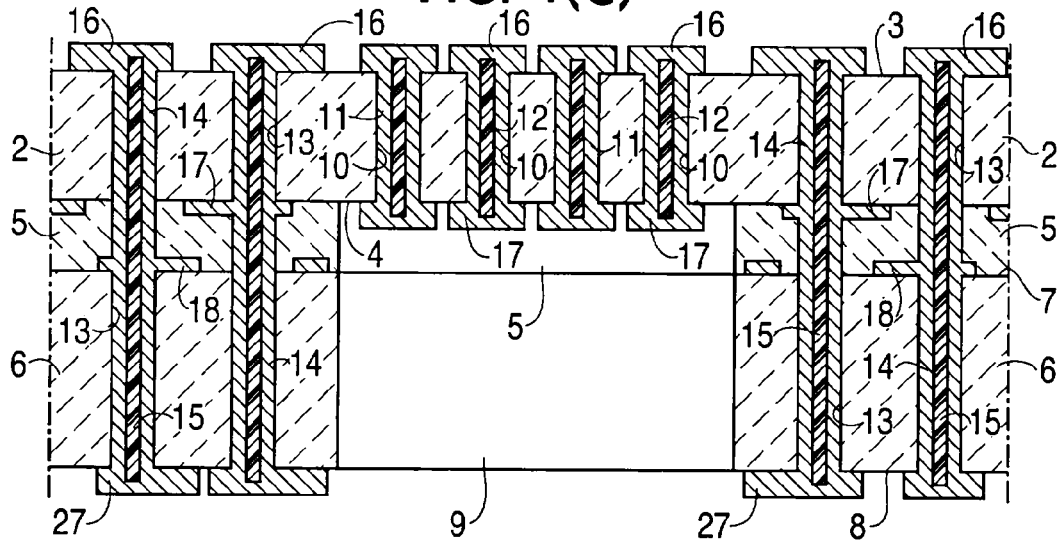

Next, a plating catalyst similar to that described previously with reference to FIG. 3 is applied to the inner walls of the through holes 13, followed by electroless copper plating and copper electroplating. As a result, as shown in FIG. 4(C), the through hole conductor 14 is formed on the inner wall of each through hole 13. Notably, in order to prevent entry of a plating solution into the recess 9, before the plating is performed, the opening of the recess 9 is covered with tape, or the recess 9 is filled with resin. After the plating is completed, the tape or resin is removed.

Next, as shown in FIG. 4(C), after the plated through holes 13 are individually filled with the filler resin 15, the upper and lower ends of the through holes 13 are covered through plating. Notably, the upper and lower ends of the plated through holes 11 located above the recess 9 are also covered through plating.

Figure 5A:
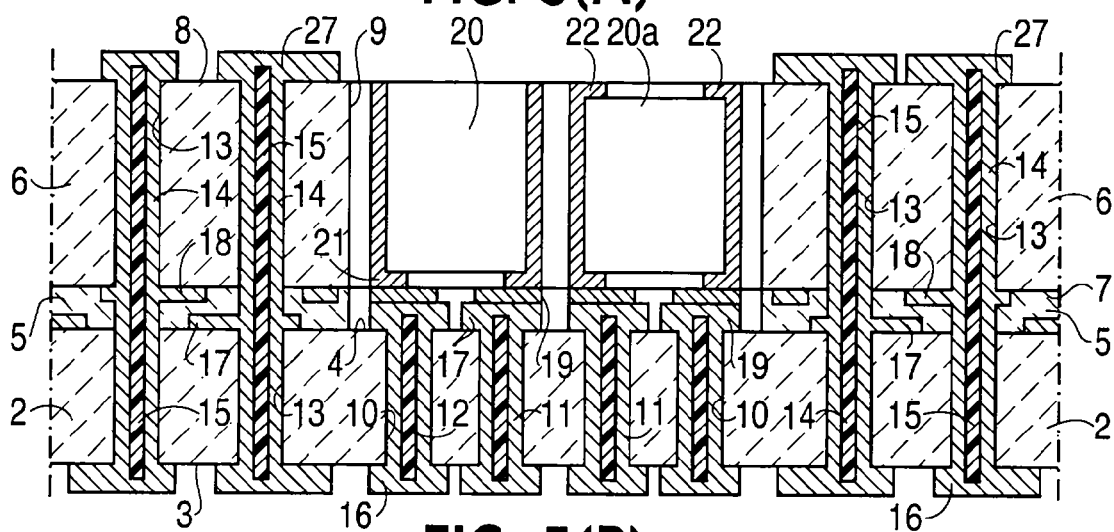
FIGS. 5(A) to 5(C) are schematic views showing major fabrication steps subsequent to that of FIG. 4(C).

As shown in FIG. 5(A), a laminate of the first and second core substrates 2 and 6 is turned upside-down by 180 degrees. In this state, chip capacitors 20 or 20a are placed in the recess 9, which is open upward, by use of an unillustrated chip mounter. In this case, the solder 19 is formed beforehand on the wiring layer (electronic component connection terminals) 17 located at the bottom of the recess 9. The electrodes 21 of the chip capacitors 20 or 20a are individually connected to the wiring layer 17 via the solder 19.

Through the above-described steps, fabrication of the wiring substrate 1 is completed. Subsequent steps for fabricating the wiring substrate 1a will next be described.

Figure 5B:
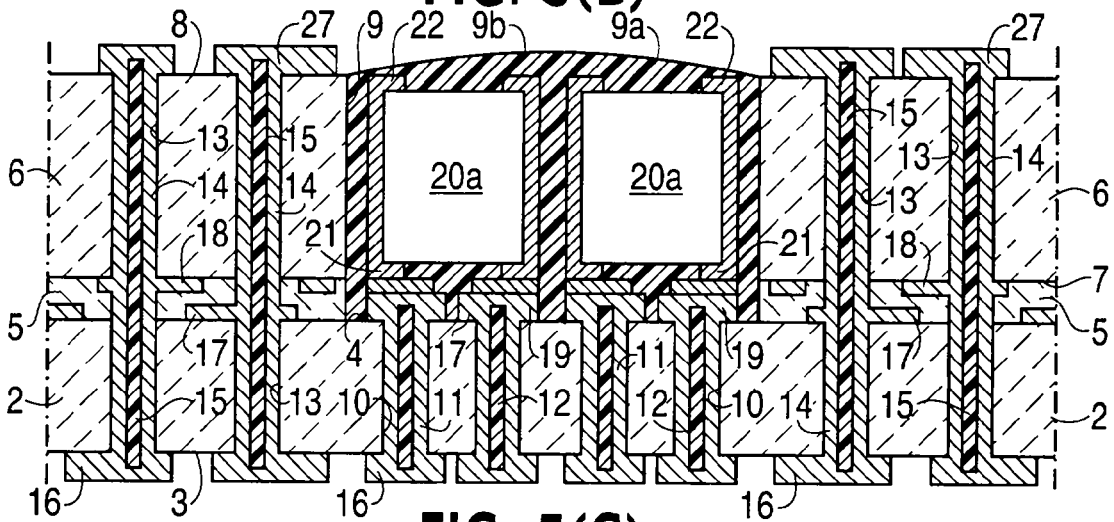

As shown in FIG. 5(B), the molten embedding resin 9a is placed in the recess 9, followed by a defoaming process and a curing process, in which the embedding resin 9a is heated to a temperature of about 100° C. and is then maintained at that temperature for about 60 minutes. Next, a swollen back surface 9b of the embedding resin 9a is leveled, for example, by buffing.

Figure 5C:
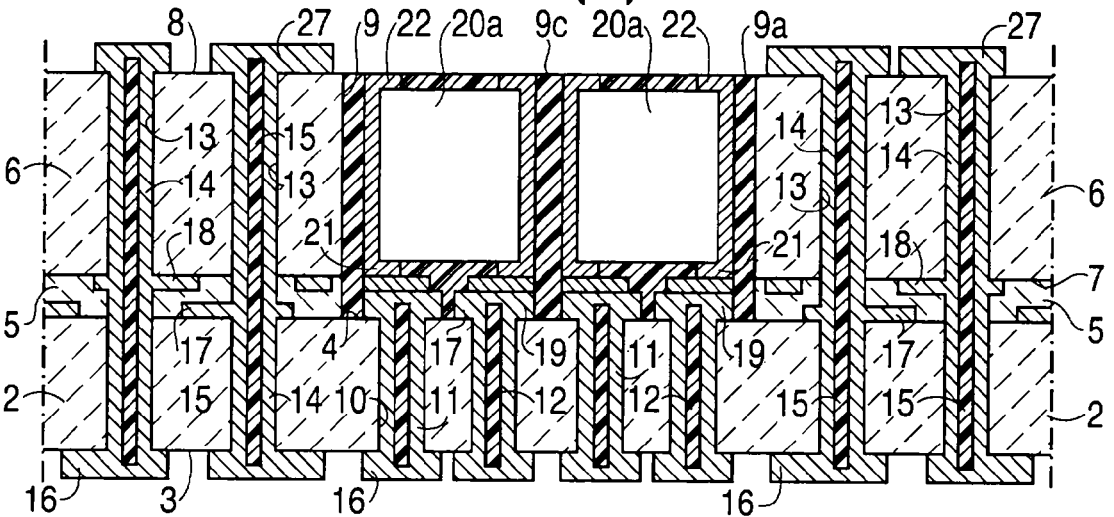

As a result, as shown in FIG. 5(C), a flat surface 9c is formed such that the electrodes 22 of the chip capacitors 20a are exposed thereat. The wiring layer 27 is also formed on the electrodes 22.

Subsequently, or in the state of FIG. 5(A), the wiring layers 25 and 30, the dielectric layers 23, 26, and 32, the via conductors 24 and 28, etc. are formed by a known build-up process (a semi-additive process, a fall additive process, a subtractive process, a process of forming dielectric layers through lamination of film-like resin materials, a photolithographic technique, or a like process or technique), thereby forming the build-up layer BU. As a result, the wiring substrate 1 or 1a shown in FIG. 1 or 2 is obtained.

Figure 6:
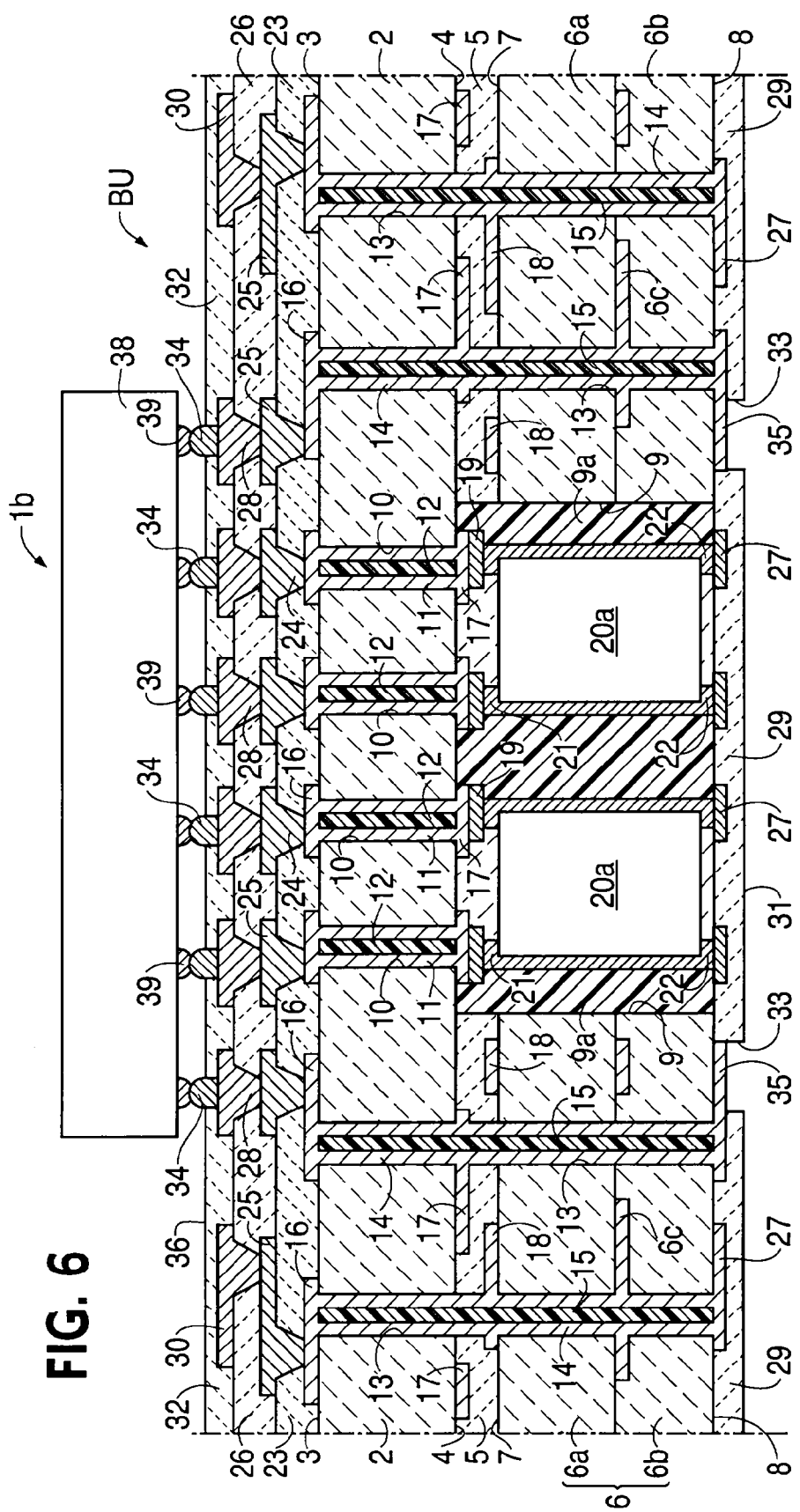
FIG. 6 is a sectional view showing a main portion of a wiring substrate according to another embodiment of the present invention.
Figure 7:
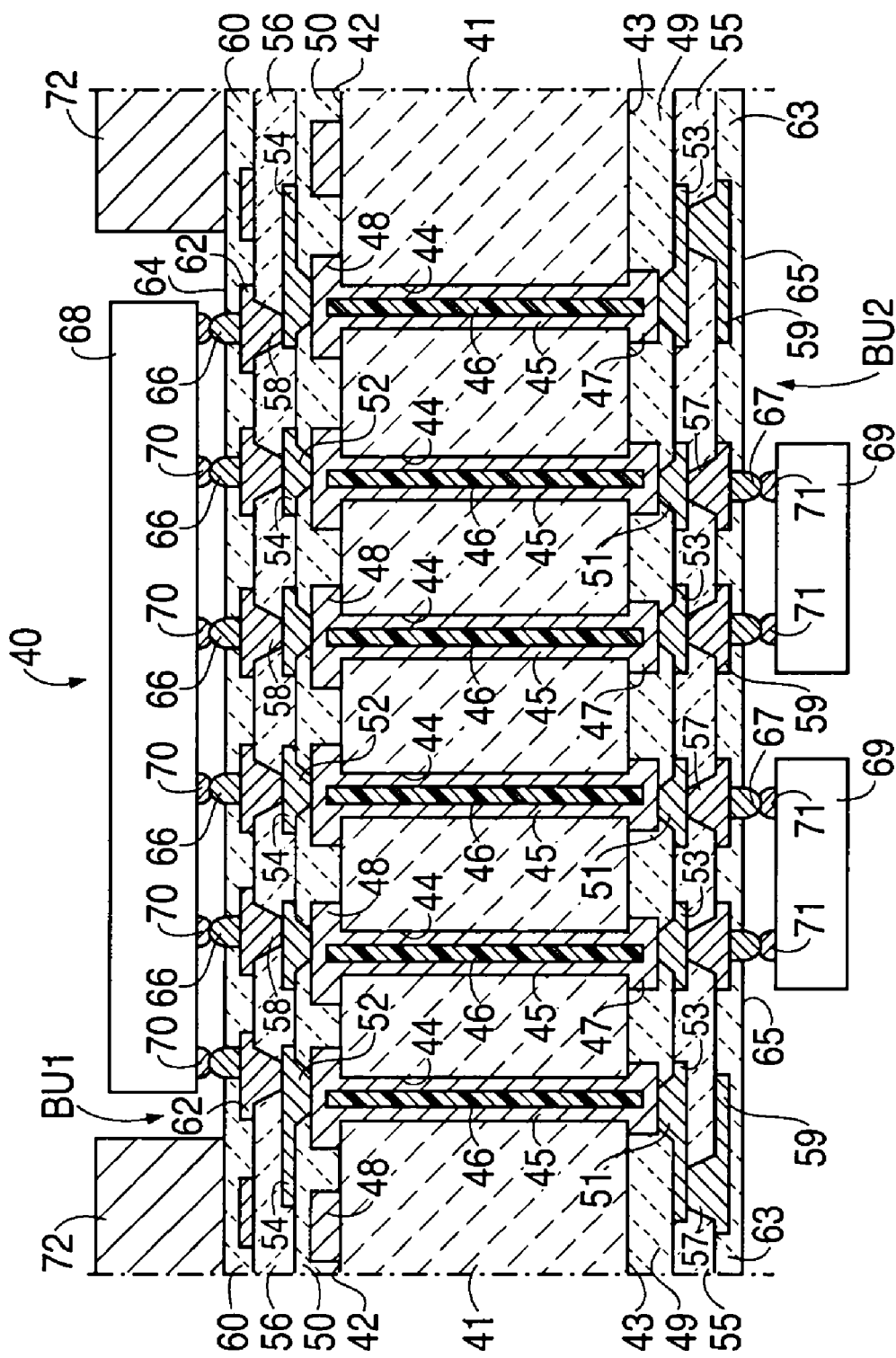
FIG. 7 is a sectional view showing a main portion of a conventional wiring substrate.

FIG. 6 is a sectional view showing a main portion of a wiring substrate 1b according to an applied embodiment of the wiring substrate 1 or 1a. Structural features or elements similar to those of the previously described embodiments are denoted by common reference numerals in the description below.

As shown in FIG. 6, the wiring substrate 1b also includes a relatively thin first core substrate 2; a relatively thick second core substrate 6; and a build-up layer BU formed on a front surface 3 of the first core substrate 2 and including wiring layers 16 and 25 and dielectric layers 23 and 26.

The first core substrate 2 includes the front surface 3 and a back surface 4, has a thickness similar to that of the previously described embodiments, and is formed of a glass-epoxy resin. A plurality of through holes 10 extend through a central portion of the first core substrate 2. A through hole conductor 11 made of copper is formed on the inner wall of each through hole 10, and each through hole 10 is filled with a filler resin 12.

As shown in FIG. 6, the second core substrate 6 includes a front surface 7 and a back surface 8, has a thickness of about 800 μm, and is formed of a glass-epoxy resin. A recess 9 is formed in a substantially central portion of the second core substrate 6. A plurality of through holes 13 extend through the first and second core substrates 2 and 6. A long through hole conductor 14 is formed on the inner wall of each through hole 13, and each through hole 13 is filled with a filler resin 15.

As shown in FIG. 6, constituent substrates 6a and 6b each having a thickness of about 400 μm are laminated to form the second core substrate 6. A wiring layer 6c is formed beforehand on the back surface of the constituent substrate 6a to thereby be sandwiched between the constituent substrates 6a and 6b. The wiring layer 6c is connected to intermediate portions of certain through hole conductors 14, which extend through the front and back surfaces 7 and 8.

Notably, the constituent substrates 6a and 6b may be laminated into the second core substrate 6 via a dielectric layer (a bonding layer formed of prepreg) 5 having adhesive properties. The recess 9 may be formed from a through opening 9, which is formed through drilling or a like process in the second core substrate 6 obtained through lamination of the constituent substrates 6a and 6b.

As shown in FIG. 6, the first core substrate 2 and the second core substrate 6 are laminated in the thickness direction thereof via the dielectric layer (prepreg) 5 similar to that of the previously described embodiments.

Wiring layers 17 and 18 similar to those of the previously described embodiments are formed on the back surface 4 of the first core substrate 2 and the front surface 7 of the second core substrate 6 and are connected to the lower ends of the through hole conductors 11 or intermediate portions of certain through hole conductors 14. Further, as shown in FIG. 6, the wiring layer 16 similar to that of the previously described embodiments is formed on the front surface 3 of the first core substrate 2 and is connected to the upper ends of the through hole conductors 11 and 14. The dielectric layers 23 and 26, filled via conductors 24 and 28, a solder resist layer (a dielectric layer) 32, and wiring layers 25 and 30 are formed on the front surface 3 and the wiring layer 16 in a manner similar to that of the previously described embodiments. The wiring layers 16, 25, and 30 and the dielectric layers 23, 26, and 32 constitute the build-up layer BU.

As shown in FIG. 6, a plurality of solder bumps (IC connection terminals) 34 are formed on the wiring layer 30 in so as to project upward from a first main surface 36 and are connected to a plurality of corresponding connection terminals 39 located on the bottom surface of an IC chip (a semiconductor device) 38 to be mounted. The solder bumps 34 are arranged such that the center-to-center distance (the pitch) of the adjacent solder bumps 34 is about 150 μm.

As shown in FIG. 6, a plurality of chip capacitors (electronic components) 20a are contained via an embedding resin 9a in the recess 9, which is defined by the first and second core substrates 2 and 6. The electrodes 21 projecting from the upper end of each capacitor 20a are connected to the wiring layer (the electronic component connection terminals) 17 via the solder 19, and electrodes 22 projecting from the lower end of each capacitor 20a are connected to a wiring layer 27, which is formed of copper in a predetermined pattern on the back surface 8 of the second core substrate 6. Notably, the chip capacitors 20a may be mounted in the recess 9 without use of the embedding resin 9a, while the electrodes 21 are connected to the wiring layer 17 via the solder 19.

Further, as shown in FIG. 6, a solder resist layer (a dielectric layer) 29 similar to that of the previously described embodiments is formed on the back surface 8 of the second core substrate 6 and the wiring layer 27. A wiring 35 in the wiring layer 27 is exposed in openings 33, which are formed in the solder resist layer 29 so as to open at the surface (the lower surface) of the solder resist layer 29, which surface serves as a second main surface 31. The surface of the wiring 35 is plated with Ni and Au to thereby serve as a connection terminal for connection to an unillustrated printed wiring board, such as a mother board, on which the wiring substrate 1b is to be mounted.

According to the thus-configured wiring substrate 1b, the first and second core substrates 2 and 6 (6a and 6b) are laminated, thereby avoiding the necessity of employing a reinforcement, and thus allowing low-cost fabrication. Also, the connection terminals 39 of the IC chip 38 mounted on the first main surface 36 and the electrodes 21 of the chip capacitors 20a contained in the recess 9 are connected via short paths as in the case of the previously described embodiments. Thus, the loop inductance and the resistance of the paths can be reduced, whereby stable electrical continuity can be established.

Further, the solder bumps 34 projecting from the first main surface 36 can be formed not only at positions corresponding to wiring paths which are routed along the through hole conductors 11 extending through the first core substrate 2 and electrically connected to the electronic components 20a but also at positions corresponding to wiring paths which are routed along the through hole conductors 14 extending through the first and second core substrates 2 and 6 (6a and 6b). Accordingly, the plurality of solder bumps 34 can be arranged at high density, whereby the IC chip 38 having a number of connection terminals 39 can be reliably mounted. Also, the first and second core substrates 2 and 6 (6a and 6b) include the internally formed wiring layers 17, 18, and 6c, which can be electrically connected to the external wiring layer 16 and the IC chip 38 via the through hole conductors 14. Thus, wiring in a multilayer structure can be obtained at low cost without employing of a buildup process which establishes electrical continuity by use of via conductors.

The present invention is not limited to the above-described embodiments.

Material for the core substrates 2 and 6 is not limited to the aforementioned glass-epoxy-resin composite material. The core substrates 2 and 6 may be formed of any of the following: bismaleimide triazine (BT) resin; epoxy resin; glass woven fabric having heat resistance, mechanical strength, flexibility, and machinability similar to those of the glass-epoxyresin composite material; and a glass-fiber-resin composite material having heat resistance, mechanical strength, flexibility, and machinability similar to those of the glass-epoxy-resin composite material, which glass-fiber-resin composite material is a composite material of glass fiber, such as glass woven fabric, and resin, such as epoxy resin, polyimide resin, or BT resin. Alternatively, a composite material of resin and organic fiber may be used, such as polyimide fiber, or a resin-resin composite material formed by impregnating a fluorine-containing resin in a three-dimensional network structure, such as continuously porous PTFE, with resin such as epoxy.

A single electronic component may be mounted or contained in the recess 9. By contrast, in a panel which is to be divided into a number of substrates and contains a number of wiring substrates 1, 1a, and 1b, a plurality of recesses 9 may be formed on a product basis. Further, a plurality of chip-implemented electronic components may be side-to-side bonded into a unit, which is to be contained in the recess 9. Chip-implemented electronic components include, in addition to the chip capacitors 20 and 20a, chip-implemented passive components, such as chip inductors, chip resistors, and chip filters, and chip-implemented active components, such as chip transistors, semiconductor chips, chip FETs, and chip low noise amplifiers (LNAs). Also, electronic components of different kinds may be contained in the same recess 9 formed in the wiring substrate 1, 1a, or 1b.

Material for the wiring layers 16 and 25, the through hole conductors 11, etc., is not limited to Cu as used in the above embodiments. Ag, Ni, Ni—Au, or a like material may be used. Also, instead of using a plating layer of any of such metals, an electrically conductive resin may be applied for forming the throughhole conductors 11.

Material for the dielectric layers 23 and 26, etc., is not limited to the aforementioned material which contains epoxy resin as a main component. Any one of the following materials may be used having heat resistance and patterning properties similar to those of the aforementioned material: polyimide resin; BT resin; PPE resin; and a resin-resin composite material formed by impregnating a fluorine-containing resin in a three-dimensional network structure, such as continuously porous PTFE, with resin such as epoxy. Notably, the dielectric layers may be formed by thermocompression bonding of a dielectric resin film or application of liquid resin using a roll coater. Glass fabric or glass filler to be contained in the core substrates and the dielectric layers may be made of E glass, D glass, Q glass, or S glass or of a combination of two or more of the glasses.

Via conductors to be formed in dielectric layers are not limited to stacked vias as in the case of the filled via conductors 24, which are stacked coaxially, but may assume the form of a conformal via conductor, which is a via not completely filled with conductor, or the form of a buried via conductor, which extends through a plurality of dielectric layers. Further, via conductors may be stacked in a staggered form in which their axes are staggered or such that a wiring layer may extend horizontally between stacked via conductors.

According to the above-described wiring substrates of the present invention, the first and second core substrates are laminated, thereby avoiding the necessity of employing a conventionally employed reinforcement, and thus allowing low-cost fabrication. The ability to contain an electronic component in the recess defined by the two core substrates enables reduction in the length of an electrically continuous path extending between the electronic component and a semiconductor device, such as an IC chip, mounted on the surface of the build-up layer. Thus, internal electrical characteristics can be stabilized.

It should further be apparent to those skilled in the art that various changes in form and detail of the invention as shown and described above may be made. It is intended that such changes be included within the spirit and scope of the claims appended hereto.

This application is based on Japanese Patent Application No. 2001-086015 filed Mar. 23, 2001, the disclosure of which is incorporated herein by reference in its entirety.

What is claimed is:

1. A wiring substrate comprising:
   a first core substrate having a front surface and a back surface;
   a second core substrate superposed on the back surface of said first core substrate and having a through opening formed therein, the first substrate and the through opening defining a recess;
   a chip capacitor provided within the through opening of said second core substrate;
   a build-up layer portion formed on the front surface of said first core substrate and comprising a plurality of wiring layers and a plurality of dielectric layers; and
   a bonding layer interposed between said first core substrate and said second core substrate but not covering the recess, wherein said first and second core substrates are made of a glass-fiber-resin composite material.

2. The wiring substrate as claimed in claim 1, wherein said second core substrate having the through opening formed therein is thicker than said first core substrate.

3. The wiring substrate as claimed in claim 1, comprising a wiring layer interposed between said first core substrate and said second core substrate but not covering the recess.

4. The wiring substrate as claimed in claim 1, wherein said first core substrate has a thickness of not less than 100 μm and not greater than 400 μm, and said second core substrate has a thickness of not less than 500 μm and not greater than 1000 μm.

5. The wiring substrate as claimed in claim 1, wherein an open space is provided between said chip capacitor and said second core substrate.

6. The wiring substrate as claimed in claim 1, further comprising an embedding resin which contains said electronic component in the recess.

7. The wiring substrate as claimed in claim 1, wherein a portion of the recess opposite said first core substrate is covered with a wiring layer.

8. The wiring substrate as claimed in claim 1, wherein a portion of the recess opposite said first core substrate is not covered with a wiring layer.

9. The wiring substrate as claimed in claim 1, wherein said chip capacitor is surrounded by an open space.

10. A wiring substrate comprising:
    a first core substrate having a front surface and a back surface;
    a second core substrate superposed on the back surface of said first core substrate and having a through opening formed therein, the first substrate and the through opening defining a recess;
    a plurality of electronic component connection terminals located at a bottom of the recess;
    a build-up layer portion formed on the front surface of said first core substrate and comprising a plurality of wiring layers and a plurality of dielectric layers; and
    a bonding layer interposed between said first core substrate and said second core substrate but not covering the recess, wherein said first and second core substrates are made of a glass-fiber-resin composite material.

11. A wiring substrate comprising:
    a first core substrate having a front surface and a back surface;
    a second core substrate superposed on the back surface of said first core substrate, a portion of the second core substrate is removed so as to form an inner periphery;
    an electronic component;
    a build-up layer portion formed on the front surface of said first core substrate and comprising a plurality of wiring layers and a plurality of dielectric layers;
    a bonding layer interposed between said first core substrate and said second core substrate but not covering the removed portion of the second core substrate, wherein said first and second core substrates are made of a glass-fiber-resin composite material,
    wherein the electronic component is positioned so as to be surrounded by the inner periphery of the second core substrate.

12. The wiring substrate as claimed in claim 10, further including a chip capacitor in the recess connected to the connection terminals.

13. The wiring substrate as claimed in claim 11, wherein said electronic component is a chip capacitor.

14. The wiring substrate as claimed in claim 1, comprising integrated circuit connection terminals to be connected with an integrated circuit chip provided on said build-up layer portion, said integrated circuit connection terminals being electrically connected with terminals of said chip capacitor through said plurality of wiring layers.

15. The wiring substrate as claimed in claim 10, comprising integrated circuit connection terminals to be connected with an integrated circuit chip provided on said build-up layer portion, said integrated circuit connection terminals being electrically connected with said electric component connection terminals through said plurality of wiring layers.

16. The wiring substrate as claimed in claim 11, comprising integrated circuit connection terminals to be connected with an integrated circuit chip provided on said build-up layer portion, said integrated circuit connection terminals being electrically connected with terminals of said electric component through said plurality of wiring layers.

17. The wiring substrate as claimed in claim 10, further comprising a wiring layer interposed between said first core substrate and said second core substrate but not covering the recess.

18. The wiring substrate as claimed in claim 11, further comprising a wiring layer interposed between said first core substrate and said second core substrate but not covering the removed portion of the second core substrate.

19. The wiring substrate as claimed in claim 1, wherein the wiring substrate further comprises a plated through hole penetrating through said first core substrate, said bonding layer and said second core substrate, and a filler resin filling the plated through hole.

20. The wiring substrate as claimed in claim 10, wherein the wiring substrate further comprises a plated through hole penetrating through said first core substrate, said bonding layer and said second core substrate, and a filler resin filling the plated through hole.

* * * * *